(12) United States Patent
Trivedi et al.

(10) Patent No.: US 10,580,479 B2
(45) Date of Patent: Mar. 3, 2020

(54) SELF-TIME SCHEME FOR OPTIMIZING PERFORMANCE AND POWER IN DUAL RAIL POWER SUPPLIES MEMORIES

(71) Applicant: MediaTek Singapore Pte. Ltd., Singapore (SG)

(72) Inventors: Manish Trivedi, Bengaluru (IN); Dharin Nayeshbhai Shah, Bengaluru (IN)

(73) Assignee: MEDIATEK Singapore Pte. Ltd., Singapore (SG)

( * ) Notice: Subject to any disclaimer, the term of this patent is extended or adjusted under 35 U.S.C. 154(b) by 99 days.

(21) Appl. No.: 16/019,477

(22) Filed: Jun. 26, 2018

(65) Prior Publication Data

US 2019/0392889 A1 Dec. 26, 2019

(51) Int. Cl.
  *G11C 7/02* (2006.01)
  *G11C 11/408* (2006.01)
  *G11C 7/14* (2006.01)
  *G06F 1/3234* (2019.01)
  *G11C 7/06* (2006.01)
  *G11C 7/10* (2006.01)

(52) U.S. Cl.
  CPC ........ *G11C 11/4085* (2013.01); *G06F 1/3275* (2013.01); *G11C 7/06* (2013.01); *G11C 7/1072* (2013.01); *G11C 7/14* (2013.01)

(58) Field of Classification Search
  CPC ..... G11C 11/4085; G11C 7/06; G11C 7/1072; G11C 7/14
  See application file for complete search history.

(56) References Cited

U.S. PATENT DOCUMENTS

| 6,643,204 | B1 | 11/2003 | Agrawal |
| 8,724,421 | B2 | 5/2014 | Evans |
| 9,424,900 | B2 | 8/2016 | Goel |
| 10,217,506 | B1 * | 2/2019 | Asthana ................. G11C 11/418 |
| 2003/0206448 | A1 * | 11/2003 | Sung ......................... G11C 7/06 |
| | | | 365/189.07 |
| 2005/0018510 | A1 | 1/2005 | Terzioglu |

(Continued)

OTHER PUBLICATIONS

Chen et al, "A 0.6 V Dual-Rail Compiler SRAM Design on 45 nm CMOS Technology With Adaptive SRAM Power for Lower VDD_min VLSIs," IEEE Journal of Solid-State Circuits, vol. 44, No. 4, Apr. 2009, pp. 1209-1215.

(Continued)

*Primary Examiner* — Toan K Le
(74) *Attorney, Agent, or Firm* — Tong J. Lee

(57) ABSTRACT

A self-time circuitry is coupled to a first power rail to receive a first voltage and a second power rail to receive a second voltage. The self-time circuitry includes a tracking control circuit which generates a first tracking signal at the first voltage and a second tracking signal at the second voltage. In response to a memory access request, a first number of dummy discharge cells (DDCs) in a first DDC group are activated according to the first tracking signal to discharge a dummy bit line (DBL), and a second number of DDCs in a second DDC group are activated according to the second tracking signal to discharge the DBL. The DBL mimics operations of a bit line in a memory cell array and the DDCs in the first DDC group and the second DDC group mimic operations of bit cells in the memory cell array.

20 Claims, 9 Drawing Sheets

(56) References Cited

U.S. PATENT DOCUMENTS

| | | | |
|---|---|---|---|
| 2007/0008771 A1* | 1/2007 | Lee | G11C 7/14 |
| | | | 365/154 |
| 2013/0135948 A1* | 5/2013 | Hirabayashi | G11C 11/412 |
| | | | 365/191 |
| 2015/0067290 A1* | 3/2015 | Chaba | G06F 13/1689 |
| | | | 711/167 |

OTHER PUBLICATIONS

Grover et al, "Low Standby Power Capacitively Coupled Sense Amplifier for Wide Voltage Range Operation of Dual Rail SRAMs," 2015 International Conference on IC Design & Technology (ICICDT), Jun. 2015.

Kulkarni et al, "Dual-VCC 8T-bitcell SRAM Array in 22nm Tri-Gate CMOS for Energy-Efficient Operation across Wide Dynamic Voltage Range," 2013 Symposium on VLSI Circuits Digest of Technical Papers.

* cited by examiner

SELF-TIME SCHEME FOR OPTIMIZING PERFORMANCE AND POWER IN DUAL RAIL POWER SUPPLIES MEMORIES

TECHNICAL FIELD

Embodiments of the invention relate to power management in a memory system.

BACKGROUND

The timing of memory circuitry can critically affect its performance and power consumption. Memory manufacturers have incorporated self-time circuitry into the internal memory circuitry to control timing independently of externally generated clock signals. The self-time circuitry controls the timing for accessing and pre-charging the memory cells.

To ensure robust memory operations, memory read and write margins must be met across all process, voltage and temperature (PVT) conditions and memory configurations. Self-time circuitry tracks memory operations for given instance sizes and PVT conditions, and automatically turns off internal operations of the memory upon completion of the operations to save power. Memory performance, design margins, and robustness are dependent upon the effectiveness of self-time circuitry.

Modern process technology continues to scale down spatial dimensions of memory devices. The confined spatial dimensions increase statistical variations and interconnect resistance. Interconnect RC delay becomes a significantly contributor of overall delay. Dependent upon PVT conditions, varying contributions from gate delays and RC delays present more challenges to the design of self-time circuitry.

Conventional self-time circuitry does not effectively track process corners variations in gate versus parasitic RC delays, hence functional failures may occur at faster process corners and sluggish performance at slower process corners. To ensure sufficient read and write margins at fast process corners, some self-time circuitry is delayed which results in further performance degradation at slower process corner.

Furthermore, conventional self-time circuitry is ineffective for dual-rail memory devices. Dual-rail memory architecture separates the core voltage of memory cells from the periphery voltage of peripheral circuits in the memory device. This separation allows the memory cells to have a stable voltage within a safe voltage range while the periphery voltage may be significantly lowered to reduce leakage current in the peripheral circuits. The periphery voltage can be varied to optimize between performance and power as per system requirements. Conventional self-time circuitry for dual-rail memory either provides surplus read and write margins, or insufficient margins which result in read or write failures. Therefore, there is a need for improving the self-time mechanism in a dual-rail memory device to optimize performance and power consumption.

SUMMARY

In one embodiment, a self-time circuitry is provided. The self-time circuitry is coupled to a first power rail to receive a first voltage and a second power rail to receive a second voltage. The self-time circuitry includes a tracking control circuit and dummy discharge cells (DDCs). The tracking control circuit is operative to generate a first tracking signal at the first voltage and a second tracking signal at the second voltage. The DDCs include at least a first DDC group and a second DDC group. In response to a memory access request, a first number of DDCs in the first DDC group are activated according to the first tracking signal to discharge a dummy bit line (DBL), and a second number of DDCs in the second DDC group are activated according to the second tracking signal to discharge the DBL. The DBL mimics operations of a bit line in a memory cell array and the DDCs in the first DDC group and the second DDC group mimic operations of bit cells in the memory cell array.

In another embodiment, a method of a self-time circuitry is provided. The self-time circuitry is coupled to a first power rail to receive a first voltage and a second power rail to receive a second voltage. The method comprises generating a first tracking signal at the first voltage and a second tracking signal at the second voltage; and in response to a memory access request, activating a first number of DDCs in a first DDC group according to the first tracking signal to discharge a DBL, and activating a second number of DDCs in a second DDC group according to the second tracking signal to discharge the DBL. The DBL mimics operations of a bit line in a memory cell array and the DDCs in the first DDC group and the second DDC group mimic operations of bit cells in the memory cell array.

The self-time circuitry and method described herein adapt to PVT conditions in a memory device. Self-time delay can be adjusted to ensure adequate read and write margins with optimized performance and power for dual-rail memory devices.

BRIEF DESCRIPTION OF THE DRAWINGS

The invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of a self-time mechanism for dual-rail memory devices are disclosed herein. A tracking control circuit generates tracking signals which adapt to and depend upon both the core voltage (Vcore) and the periphery voltage (Vperi) of the dual-rail power supplies. In a dual-rail scenario when Vcore>Vperi, the core-voltage-dependent tracking signal attempts to speed up the generation of a reset signal while the periphery-voltage-dependent tracking signal attempts to slow down the reset. On the other hand, when Vperi>Vcore, the periphery-voltage-dependent tracking signal attempts to speed up the generation of the reset while the core-voltage-dependent tracking signal attempts to slow down the reset. Hence based upon voltage supply levels at the core and the periphery, the reset signal can be adjusted accordingly to ensure optimal memory operations with respect to performance and power.

Conventional approaches to memory timing limits dual-rail voltages to Vcore>Vperi. With the self-time mechanism described herein, a memory device may operate with Vperi>Vcore as well as Vcore>Vperi. In a dual-rail memory device where the relative values of Vcore and Vperi vary significantly (e.g., Vcore=0.9 volts vs. Vperi=0.5 volts; Vcore=0.8 volts vs. Vperi=1.0 volts), the self-time mechanism can efficiently control the internal memory timing and improves the power and performance of the memory device.

According to embodiments of the invention, memory reset is dependent on a tracking delay (also referred to as "self-time delay"), which is in turn governed by both core and periphery voltages. Hence, in a dual-rail memory device when Vcore>Vperi or vice-versa, memory reset adjusts accordingly to ensure optimal self-time pulse width.

The self-time mechanism adjusts memory control signals based on the instance size and PVT conditions of the memory cells. At faster process corners where RC delay dominates gate delay, the reset time is predominately decided by RC delays to avoid premature termination of signals, while at slower process corners the reset time is decided by gate delays.

Figure 1:
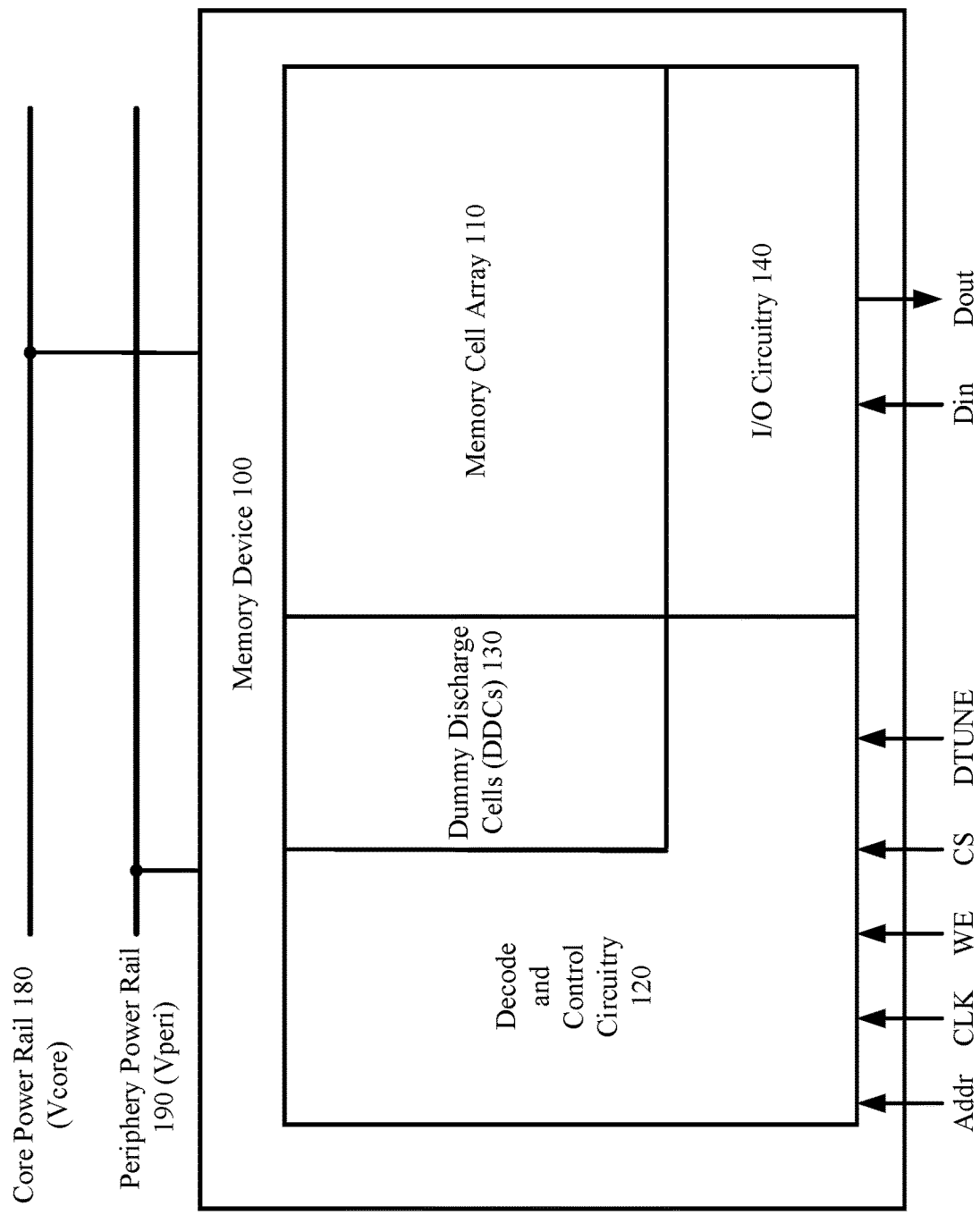
FIG. 1 illustrates a memory device in which embodiments of the invention may operate according to one embodiment.

FIG. 1 illustrates a memory device 100 in which embodiments of the invention may operate according to one embodiment. The memory device 100 includes a memory cell array 110 which further includes a plurality of bit cells arranged in rows and columns. Non-limiting examples of the memory device 100 includes Static Random Access Memory (SRAM) memory, Read-only memory (ROM), Dual Port (DP) memory, Ternary Content-Addressable Memory (TCAM), Pseudo-Dual Port (PDP), Double Pump memory. The self-time mechanism to be described herein is applicable to all types of memories. The memory device 100 receives power from both a core power rail 180 at a core voltage level (Vcore) and a periphery power rail 190 at a periphery voltage level (Vperi). Vcore is mainly supplied to the memory cell array 110 and Vperi is mainly supplied to the peripheral logic of the memory device 100. In the embodiments herein, both Vcore and Vperi are supplied to decode and control circuitry 120 and dummy discharge cells (DDCs) 130, to provide a fine-grained self-time delay control.

The decode and control circuitry 120 receives input addresses and control signals, such as the clock (CLK), read/write addresses (Addr), a delay tune (DTUNE) signal, as well as a number of control signals for read and write operations, e.g., write enable (WE) and chip select (CS), etc. The DTUNE signal is used to control the self-time delay by selectively turning on a programmable number of DDCs 130. The DDCs 130 and the control of the DDCs 130 will be explained in detail later. Additionally, the memory device 100 includes I/O circuitry 140, which receives data input (Din) for write operations and sends out data output (Dout) for read operations.

Figure 2:
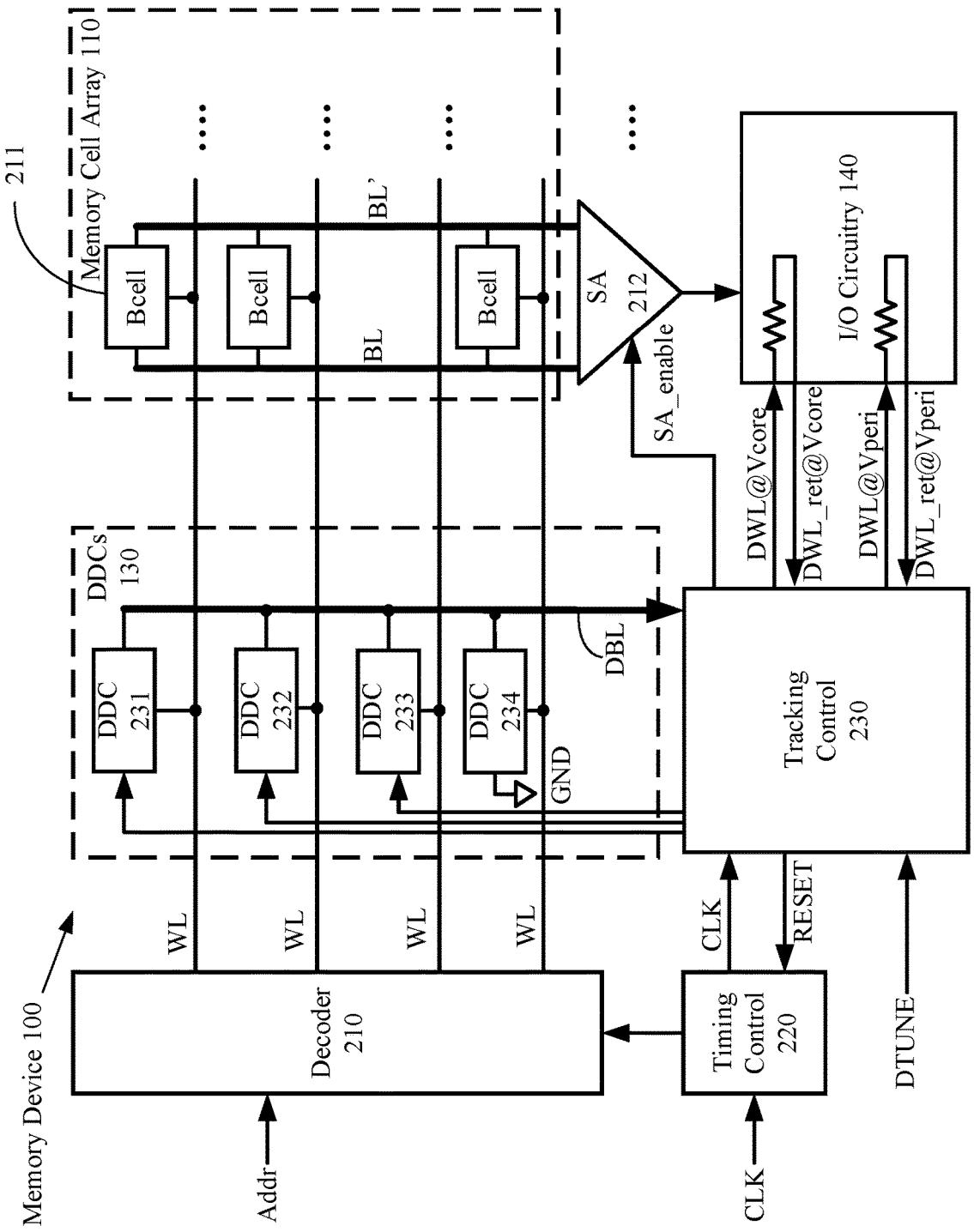
FIG. 2 illustrates circuitry in the memory device of FIG. 1 according to one embodiment.

FIG. 2 illustrates in further detail the circuitry in the memory device 100 according to one embodiment. The memory cell array 110 includes an array of bit cells (shown as Bcells 211) arranged in rows and columns. Only one column is shown in FIG. 2 for simplicity of illustration. Each Bcell 211 is connected to a word line (WL), a bit line (BL) and a bit line bar (BL'), where BL' is complementary to BL. When the memory device 100 receives a memory address for a read operation, a decoder 210 decodes the memory address and selects the decoded memory word by asserting (i.e., enabling) a corresponding WL. When a WL is asserted, each Bcell 211 on that WL starts to discharge to its connecting BL and BL' pair (denoted as BL-BL' pair), causing a voltage differential between the BL-BL' pair. Each BL-BL' pair is connected to a corresponding sense amplifier (SA) 212, which outputs the sensed data when receiving an enable signal (e.g., SA_enable). To ensure correctness of the sensed data, each sense amplifier 212 is enabled to sense data when the voltage differential across the BL-BL' pair is at or greater than an offset (SA_offset).

The memory device 100 includes self-time circuitry which enables (i.e., turns on) the sense amplifiers 212 by sending the SA_enable signal such that each sense amplifier 212 is turned on only when the voltage differential across the BL-BL' pair is at or greater than SA_offset. The amount of time required for the accessed bit cells to drive the bit lines to adequate voltage differential is not constant, but rather varies with PVT conditions. The memory device 100 includes self-time circuitry that delays turning on the sense amplifier 212 until the voltage differential is at or greater than SA_offset. The amount of delay can be adjusted at runtime of the memory device 100. The self-time circuitry includes the DDCs 130, and tracking control 230 which generates control signals for the DDCs 130.

The tracking control 230 tracks the word line (WL) signal and generates a first dummy word line (DWL) signal at the core voltage (i.e., DWL@Vcore) and a second DWL signal at the periphery voltage (i.e., DWL@Vperi). Both signals pass through the I/O circuitry 140 (which mimics actual word line load), and return from a predetermined point in the I/O circuitry 140 to become DWL_ret@Vcore and DWL_ret@Vperi. DWL_ret@Vcore and DWL_ret@Vperi track the word line load, and therefore they are the word-line-load-tracked version of DWL@Vcore and DWL@Vperi, respectively. Based on DWL_ret@Vcore and DWL_ret@Vperi, the tracking control 230 generates control signals to the DDCs 130. According to the DTUNE signal, a programmable number of DDCs 130 discharge to a dummy bit line (DBL). When the charge on the DBL drops to a predetermined level, the tracking control 230 generates SA_enable which enables the sense amplifiers 212 on the word line to sense the voltage differentials on their respective BL-BL' pairs.

In one embodiment, the DDCs have four groups: a first group 231 includes the DDCs connected a first programmable tracking signal at Vcore, a second group 232 includes the DDCs connected a second programmable tracking signal at Vperi, a third group 233 includes the DDCs connected to DWL_ret@Vcore and DWL_ret@Vperi, and a fourth group 234 includes the DDCs connected to ground (indicated as a downward arrow). For simplicity of illustration, only one DDC is shown in each of the groups 231, 232, 233 and 234; however, it is understood that each of these groups may include one or more of DDCs. In one embodiment, the total number of DDCs in the four groups is the same as the total number of rows in the memory cell array 110. Further details of the DDCs will be provided with reference to FIG. 3.

In one embodiment, the tracking control 230 also generates a RESET signal, which controls the termination of current memory access cycle and starts memory pre-charge. The RESET signal is sent from the tracking control 230 to a timing control 220. The timing control 220 distributes the clock signal (CLK) and the RESET signal to circuitry in the memory device 100.

Figure 3:
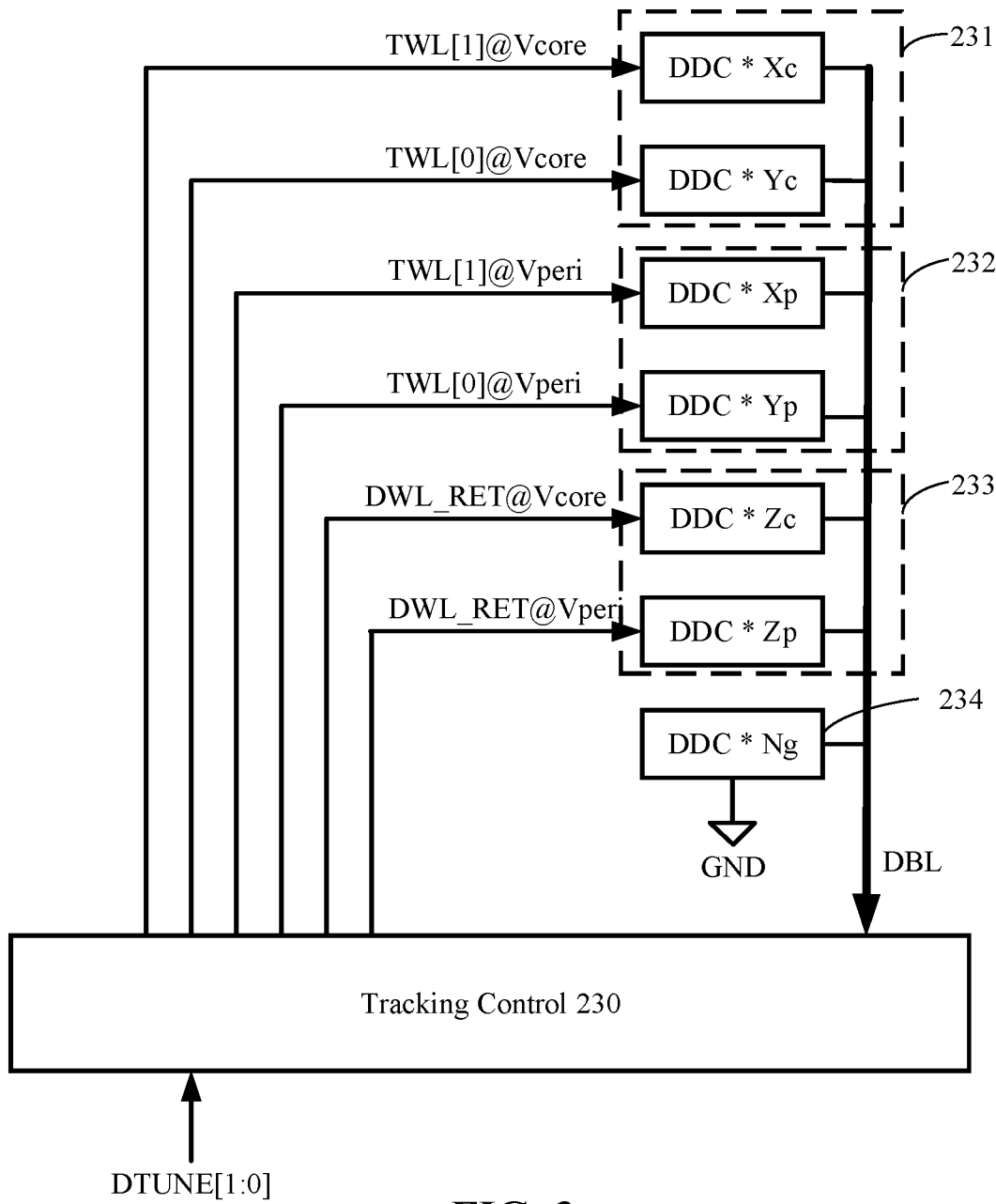
FIG. 3 illustrates the signals that control dummy discharge cells (DDCs) according to one embodiment.

FIG. 3 illustrates the signals controlling the DDCs according to one embodiment. In this example, the DDCs in the first group 231 are selectively activated (i.e., turned on) by a 2-bit tracking word line signal (TWL[1:0]) at the core voltage (denoted as TWL[1:0]@Vcore or TWL@Vcore), and the DDCs in the second group 232 are selectively activated by the 2-bit TWL[1:0] at the periphery voltage (denoted as TWL[1:0]@Vperi or TWL@Vperi). The bit values of TWL[1:0] are generated by the tracking control 230 according to the 2-bit signal DTUNE[1:0], which is received by the memory device 100 as an input. In one embodiment, bit-1 of TWL (i.e., TWL[1]) asserts when bit-1 of DTUNE is one (i.e., DTUNE[1]=1), and bit-0 of TWL (i.e., TWL[0]) asserts when bit-0 of DTUNE is one (i.e., DTUNE[0]=1). For example, when DTUNE[1:0]=10, TWL[1] is asserted and TWL[0] is de-asserted.

In one embodiment, the first group 231 of DDCs includes Xc number of DDCs controlled by TWL[1]@Vcore and Yc number of DDCs controlled by TWL[0]@Vcore. When TWL[1]@Vcore=1, all Xc number of DDCs are activated to discharge DBL, and when TWL[0]@Vcore=1, all Yc number of DDCs are activated to discharge DBL. Thus, the number of activated DDCs in the first group 231 can be selectively set to zero, Xc, Yc, or (Xc+Yc).

Similarly, the second group 232 of DDCs includes Xp number of DDCs controlled by TWL[1]@Vperi and Yp number of DDCs controlled by TWL[0]@Vperi. When TWL[1]@Vperi=1, all Xp number of DDCs are activated to discharge DBL, and when TWL[0]@Vperi=1, all Yp number of DDCs are activated to discharge DBL. Thus, the number of activated DDCs in the second group 232 can be selectively set to zero, Xp, Yp, or (Xp+Yp).

The third group 233 of DDCs includes Zc number of DDCs controlled by DWL_ret@Vcore, and Zp number of DDCs controlled by DWL_ret@Vperi. These DDCs are directly tapped to return dummy word lines (i.e., DWL_ret) at the periphery voltage and the core voltage. These DDCs are activated to discharge DBL independently of the setting of DTUNE. For example, during power up when the periphery voltage is present while the core voltage has not been turned on, the DDCs controlled by DWL_ret@Vperi can be used to discharge DBL and ensure memory reset.

The fourth group 234 of DDCs include Ng number of DDCs. These DDCs are connected to ground and serve as a load. The DDCs may be connected to additional signal lines and circuits, which are omitted from FIG. 3 for simplicity of the illustration.

As shown in the example below, the number of DDCs driven on Vperi and Vcore is tunable. In a first scenario where Xc=4, Yc=2, Xp=2, Yp=1 and Zc=Zp=1, if DTUNE [1:0]=11, then the number of activated DDCs at Vcore is Xc+Yc+Zc=7, and the number of activated DDCs at Vperi is Xp+Xp+Zp=4. If DTUNE[1:0]=00, then the number of activated DDCs at Vcore is Zc=1, and the number of activated DDCs at Vperi Zp=1. Thus, the number of activated DDCs can be tuned to set the rate at which DBL discharges. In some embodiments, the parameters Xc, Yc, Xp, Yp, Zc, Zp may be determined at circuit design time by computer simulation, and the bit value of DTUNE may be determined at runtime.

Figure 4:
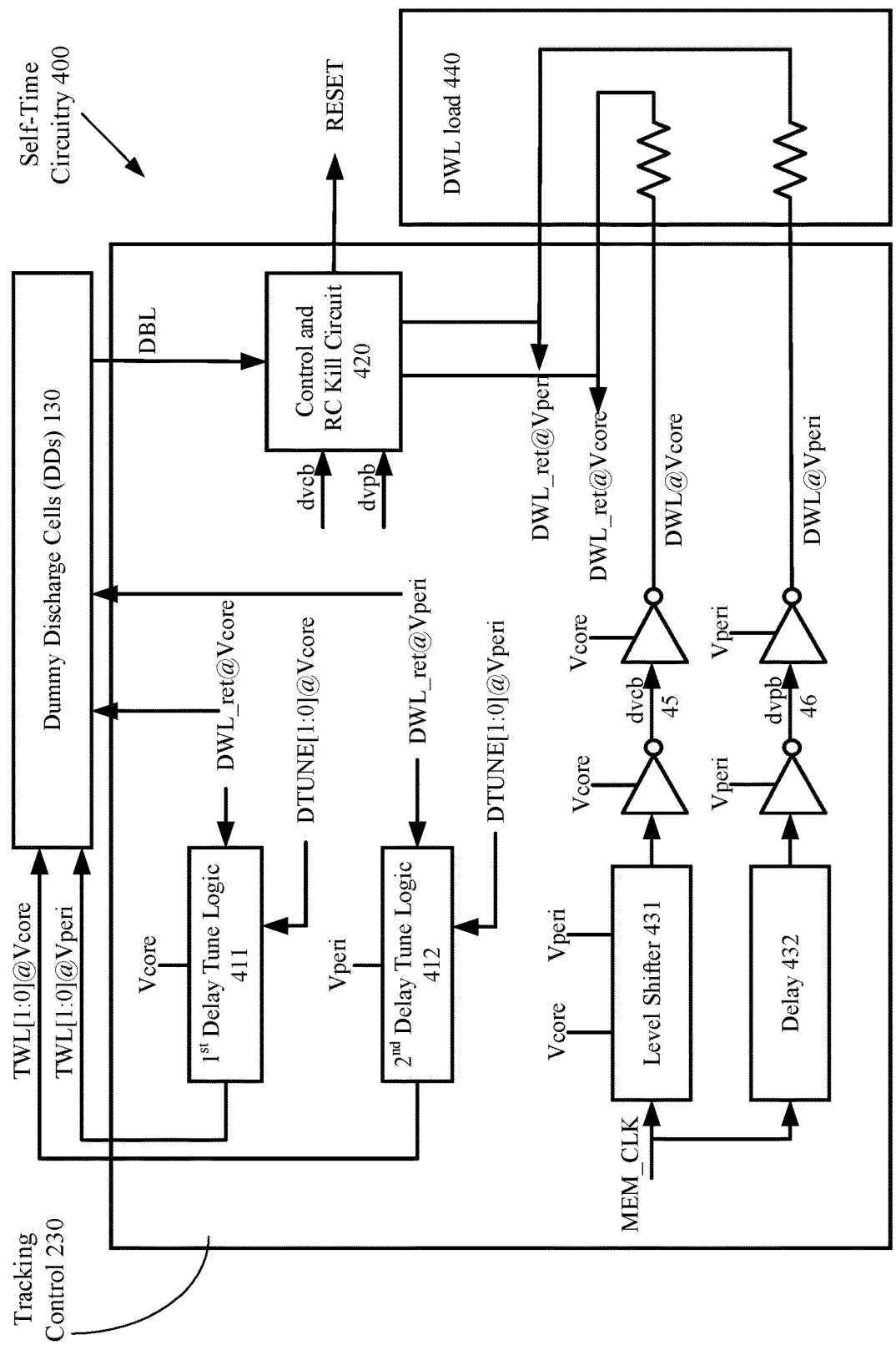
FIG. 4 illustrates a self-time circuitry according to one embodiment.

FIG. 4 illustrates self-time circuitry 400 according to one embodiment. The self-time circuitry 400 includes the DDCs 130 and the tracking control 230 shown in FIG. 2. In this embodiment, the tracking control 230 includes a first delay tune logic 411 which receives DTUNE and DWL_ret@Vcore to generate TWL@Vcore, and a second delay tune logic 412 which receives DTUNE and DWL_ret@Vperi to generate TWL@Vperi. The signals TWL@Vcore and TWL@Vperi are used to selectively assert the DDCs as described in connection with FIG. 3.

Furthermore, the tracking control 230 includes a level shifter circuit 431, a delay circuit 432 and a number of inverters which in combination generate DWL@Vcore and DWL@Vperi based on Vcore, Vperi and a memory clock (MEM_CLK). MEM_CLK is generated within the memory device 100. DWL@Vcore and DWL@Vperi (collective referred to as DWL) pass through a DWL load 440, (which may be part of the I/O circuitry 140 of FIG. 1), and return to the tracking control 230 as DWL_ret@Vcore and DWL_ret@Vperi, respectively. The signals DWL_ret@Vcore and DWL_ret@Vperi (collective referred to as DWL_ret) are used as input to the first delay tune logic 411 and the second delay tune logic 412 to generate TWL@Vcore and TWL@Vperi, respectively. Moreover, DWL_ret signals are used to assert the third group 233 of DDCs as described in connection with FIG. 3.

In one embodiment, the tracking control 230 includes a control and RC-kill circuit 420, which accelerates the termination of DWL_ret. The control and RC-kill circuit 420 also generates the RESET signal, which is used to reset a number of control signals in the memory device 100. In addition to DWL_ret from the DWL load 440, the control and RC-kill circuit 420 also receives signals dvcb 45 and dvpb 46 as input. As shown in FIG. 4, dvcb 45 and dvpb 46 are inverted DWL@Vcore and inverted DWL@Vperi, respectively. Further details of the control and RC-kill circuit 420 is described with reference to FIGS. 5A, 5B and FIG. 6.

Figure 5A:
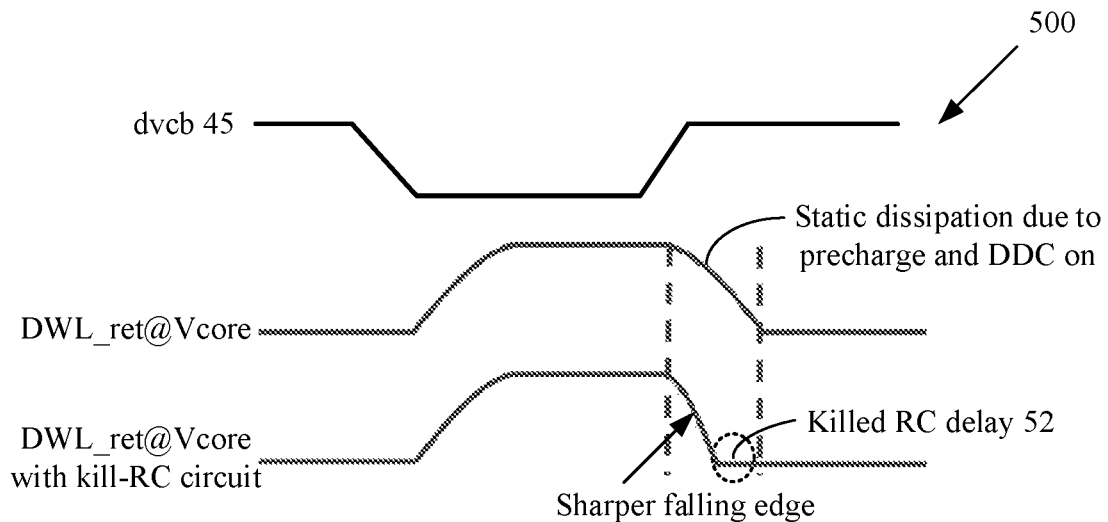
FIG. 5A is a timing diagram illustrating an "RC kill" effect on a first signal.

FIG. 5A is a timing diagram 500 illustrating an "RC kill" effect on DWL_ret@Vcore. The top row of the timing diagram is the dvcb signal 45 from which DWL@Vcore heading towards the DWL load 440 (FIG. 4) is derived. The middle row of the timing diagram 500 is the DWL_ret@Vcore coming out of the DWL load 440 before the RC kill. The bottom row of the timing diagram 500 is the DWL_ret@Vcore coming out of the DWL load 440 after the RC kill. The effect of the RC kill can be seen from the falling edge of the bottom row, which is sharper than the corresponding falling edge of the middle row. The time interval "killed RC delay 52" shows the time reduction in the falling edge of DWL_ret@Vcore with the RC kill.

Figure 5B:
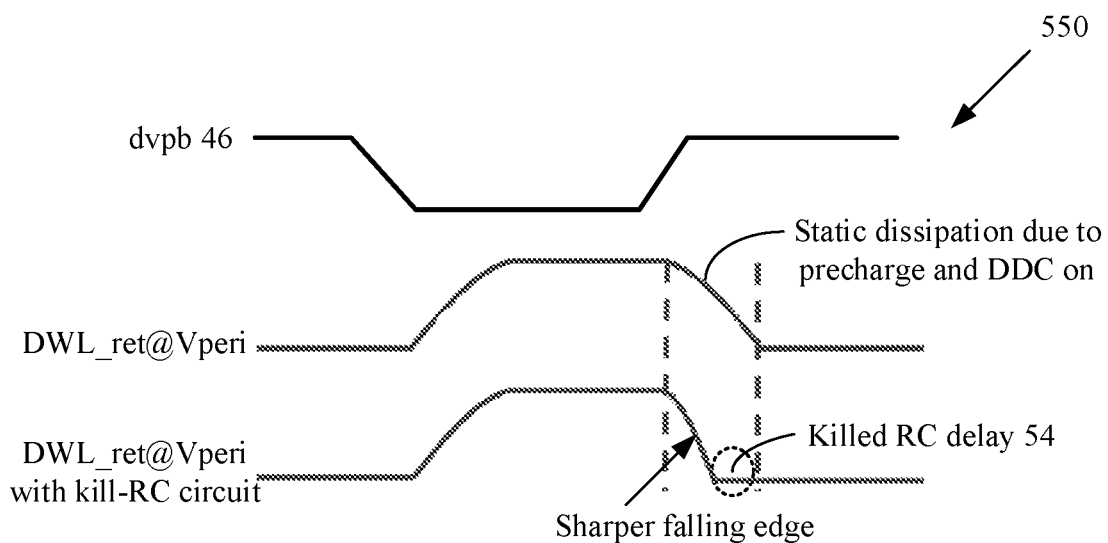
FIG. 5B is a timing diagram illustrating an "RC kill" effect on a second signal.

Similarly, FIG. 5B is a timing diagram 550 illustrating the "RC kill" effect on DWL_ret@Vperi. The top row of the timing diagram 550 is the dvpb signal 46 from which DWL@Vperi heading towards the DWL load 440 is derived. The middle row of the timing diagram 550 is the DWL_ret@Vperi coming out of the DWL load 440 before the RC kill. The bottom row of the timing diagram 550 is the DWL_ret@Vperi coming out of the DWL load 440 after the RC kill. The effect of the RC kill can be seen from the falling edge of the bottom row, which is sharper than the corresponding falling edge of the middle row. The time interval "killed RC delay 54" shows the time reduction in the falling edge of DWL_ret@Vperi with the RC kill, which reduces DBL pre-charge memory cycle time.

Figure 6:
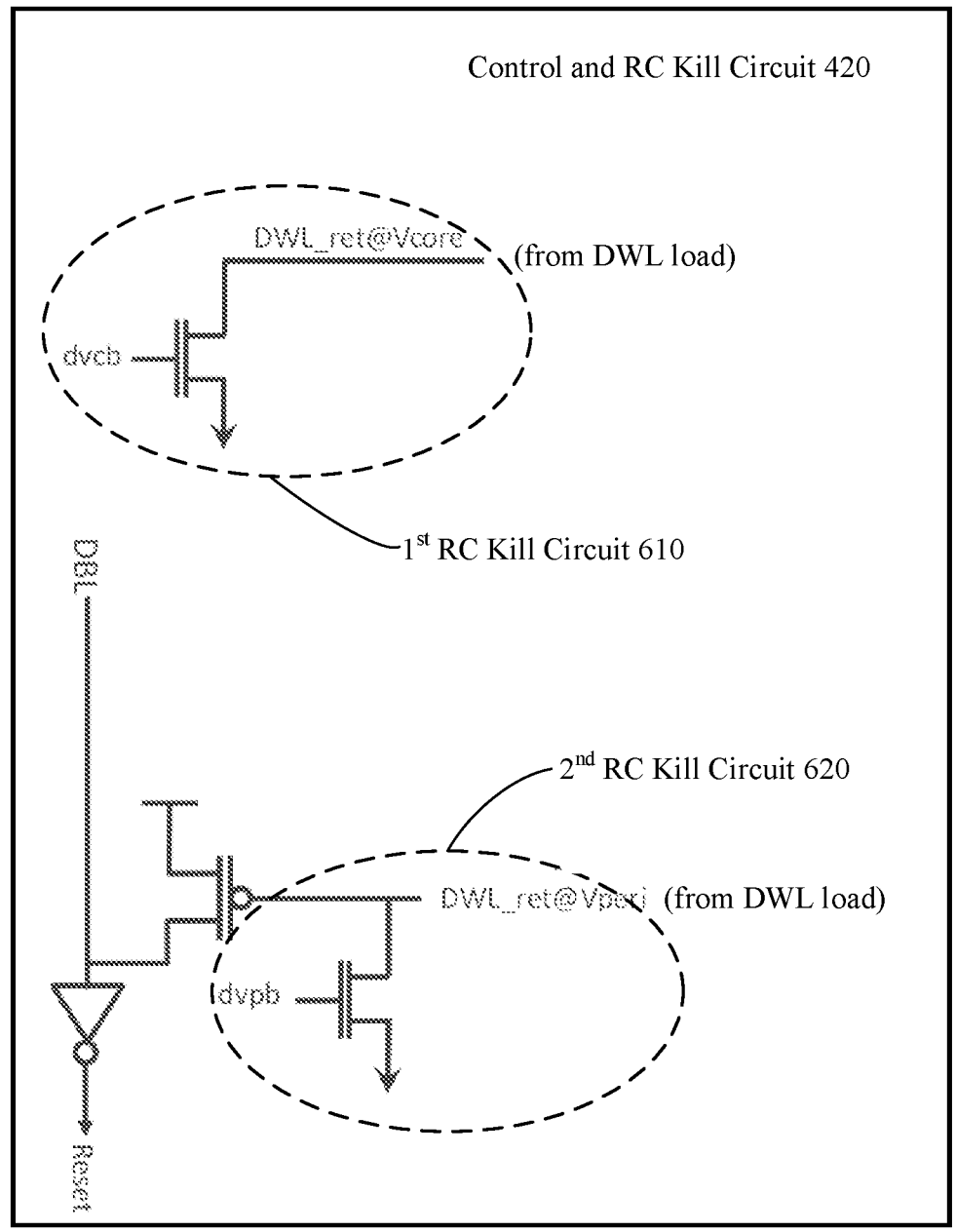
FIG. 6 is a circuit diagram for performing "RC kill" according to one embodiment.

FIG. 6 is a circuit diagram for performing "RC kill" of FIGS. 5A and 5B according to one embodiment. The control and RC kill circuit 420 of FIG. 4 includes a first RC kill circuit 610 and a second RC kill circuit 620. In one embodiment, the first RC kill circuit 610 includes an NMOS transistor 611 with its source connected to a target signal having undesired RC delay; e.g., DWL_ret@Vcore. The drain of the NMOS transistor 611 is connected to a voltage sink such as the ground, and the gate of the NMOS transistor 611 is connected to a control signal having a rising edge preceding the falling edge of the target signal; e.g., dvcb 45. When the rising edge of dvcb 45 turns on the gate of the NMOS transistor 611, the target signal is pulled down to the drain and results in a sharp termination.

Similarly, the second RC kill circuit 620 includes an NMOS transistor 621 with its source connected to a target signal DWL_ret@Vperi, its drain connected to a voltage sink such as the ground, and its gate connected to dvpb 46. When the rising edge of dvpb 46 turns on the gate of the NMOS transistor 621, the target signal is pulled down to the drain and results in a sharp termination.

In an alternative embodiment, either or both of the NMOS transistors 611 and 621 may be replaced by respective PMOS transistors, which may be turned on by the falling edge of a control signal. In some embodiment, an RC kill circuit may be connected to a control signal and a target signal different from the aforementioned example in FIG. 6, and may be used in other parts of the memory device 100 or other electronic circuitry.

As shown in FIGS. 5A and 5B, the RC kill circuitry sharply terminates the falling edge of DWL_ret without impacting its rising edge. The RC kill circuit 620 also reduces memory reset time by sharply terminating the falling edge of the RESET signal. The falling edge of Reset starts the pre-charge for the next memory cycle. The sharp termination of undesired RC provides timing and power benefits.

Figure 7:
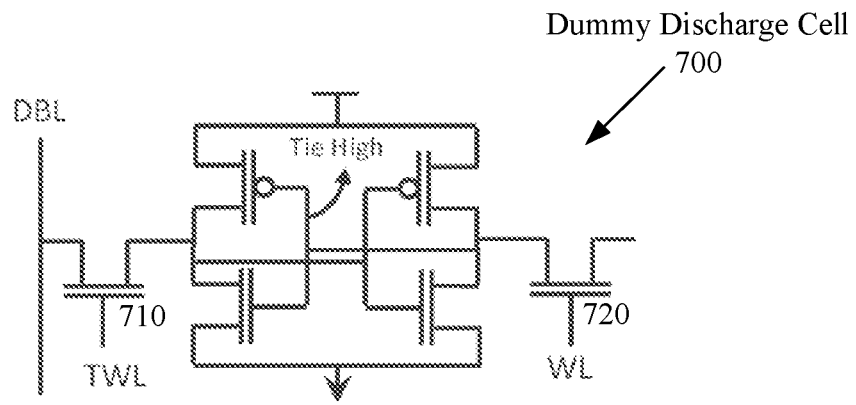
FIG. 7 is a circuit diagram illustrating a DDC connected to control signals according to one embodiment.

FIG. 7 is a circuit diagram illustrating a DDC 700 connected to control signals according to one embodiment. The DDC 700 is an example of any of the aforementioned DDCs. The DDC 700 is a six-transistor cell which, as illustrated, includes an access transistor 710 on the left, a cross-coupled pair of inverters in the middle, and an access transistor 720 on the right. The access transistor 710 has its drain connected to Vdd (which is Vcore for the first group 231 of DDCs (FIG. 3) and Vperi for the second group 232 of DDCs), its source connected to DBL, and its gate connected to TWL (which is TWL@Vcore for the first group 231 of DDCs and TWL@Vperi for the second group 232 of DDCs). The access transistor 720 has its drain connected to Vdd (which is Vcore for the first group 231 of DDCs and Vperi for the second group 232 of DDCs), and its source floating. The gate is connected to WL. The DDC 700 operates in the same way whether or not WL is asserted. If WL is asserted, the source of the access transistor 720 follows the state of its drain and does not force any state change.

Referring also to FIG. 3, each DDC in the third group 233 and the fourth group 234 of DDCs may also have the same circuit elements as the DDC 700. However, the gate of the first access transistor 710 is connected to DWL_ret@Vcore or DWL_ret@Vperi for the third group 233, and to the ground for the fourth group 234.

Figure 8:
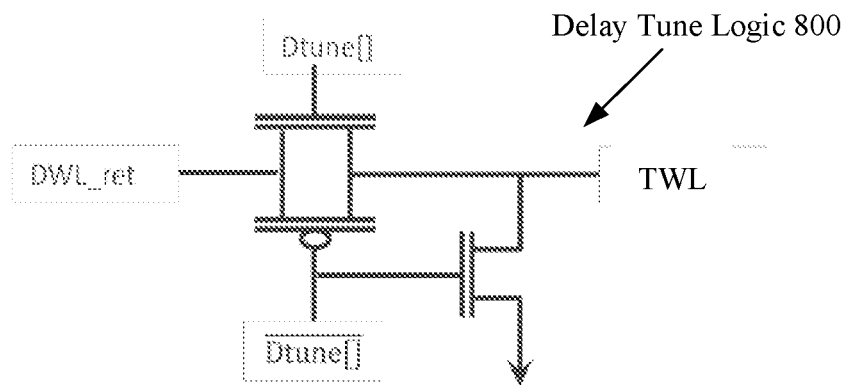
FIG. 8 is a circuit diagram illustrating a delay tune logic according to one embodiment.

FIG. 8 is a circuit diagram illustrating a delay tune logic 800 according to one embodiment. The delay tune logic 800 may be an example of the first delay tune logic 411 and/or the second delay tune logic 412 of FIG. 4. When DTUNE=1, the delay tune logic 800 passes the TWL signal to output DWL_ret, without impacting its slope which has valuable word line loading information. When DTUNE=0, the delay tune logic 800 clamps TWL to 0.

Figure 9:
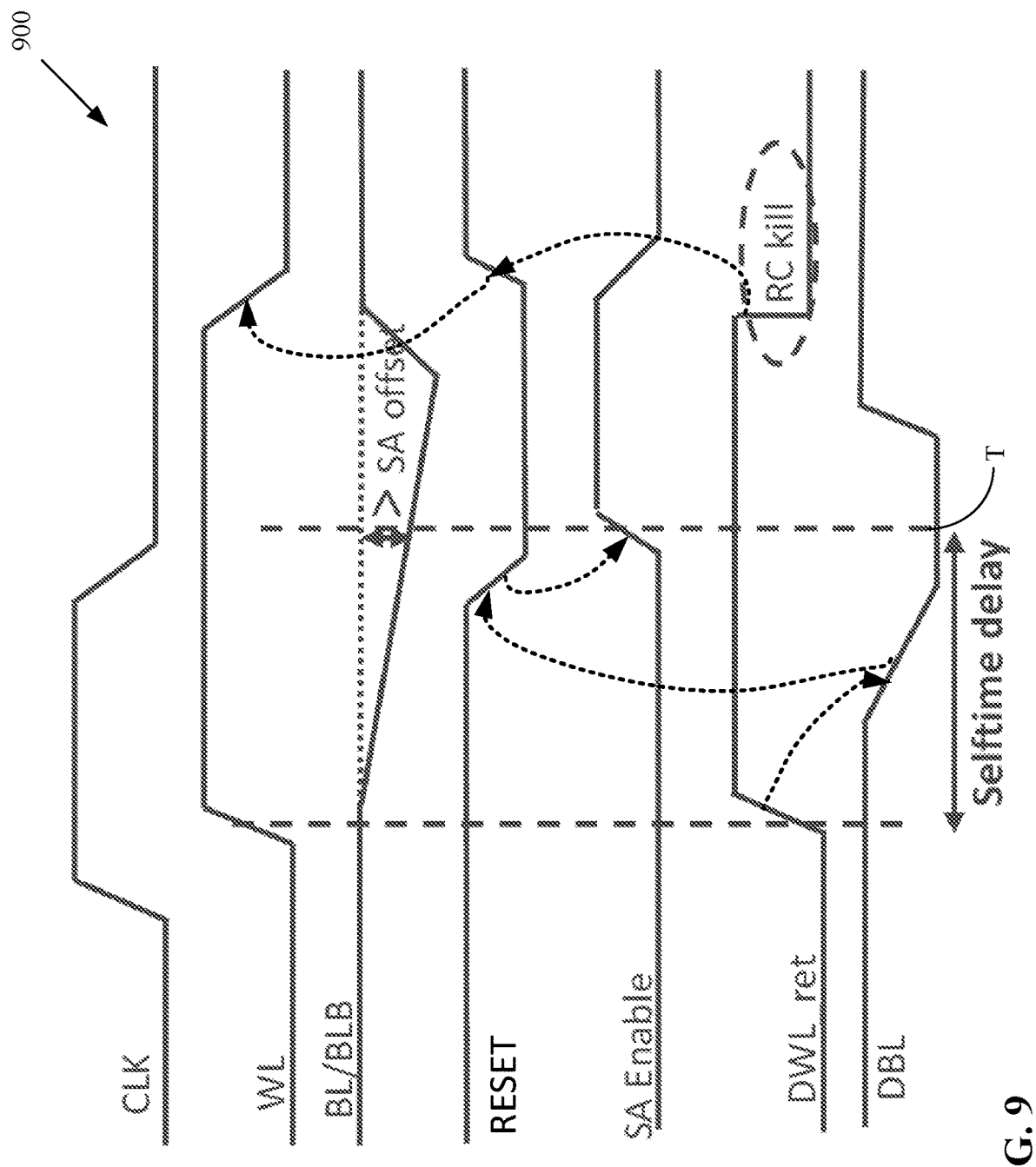
FIG. 9 is a timing diagram illustrating a set of control signals in a memory device according to one embodiment.

FIG. 9 is a timing diagram 900 illustrating a set of control signals in the memory device 100 according to one embodiment. The time lengths and the amplitudes of the signals are not drawn to scale. Moreover, the memory device 100 may use some of the signals in the inverted form; thus, an operation triggered by a rising (or falling) edge of a signal shown in FIG. 9 may instead be triggered by a falling (or rising) edge of the signal in the inverted form in an alternative embodiment.

The top row of the timing diagram 900 shows the clock signal (CLK) received by the memory device 100. In response to the rising edge of CLK and a decoded memory address, a word line (WL) is asserted to access the addressed row of memory bit cells. For a read operation, the accessed bit cells connected to the asserted WL discharge their corresponding bit line pairs BL-BL'; only one bit line pair is shown in the timing diagram for simplicity.

The tracking control 230 reacts to a memory access request by generating a number of control signals. The control signals include DWL, which mimics WL, and DBL, which mimics BL. As described with reference to FIG. 4, DWL passes through the DWL load 440 and becomes a DWL return signal; i.e., DWL_ret. The tracking control 230 uses DWL_ret to generate delay-tuned TWL to control the discharge rate of DDCs on DBL. When the voltage level on DBL drops to a threshold point, the tracking control 230 generates SA_enable (e.g., at time T) to enable the sense amplifiers to sense the voltage differential on corresponding bit line pairs BL-BL' and to produce a data output.

The time between the WL assertion and the SA_enable assertion is the self-time delay. By tuning the number of activated DDCs to discharge DBL, the time it takes to lower the DBL voltage level to trigger the SA_enable generation can be adjusted at runtime. Thus, time T can be moved forward or backward with respect to the required SA_offset. The optimal location of T is at a point where the voltage differential on BL-BL' is greater than SA_offset by a small amount (e.g., a predetermine delta), such that the enabled sense amplifier can correctly read the bit cell data with a sufficient but not wastefully large read margin.

Depending upon the number of activated DDCs (i.e., the first group 231 of DDCs and the second group 232 of DDCs in FIG. 2), DBL discharge rate can be adjusted as the discharge contribution from DDC at Vcore and DDC at Vperi is adjusted. Thus, the self-time delay based on tuning both kinds of DDCs can be adjusted with a fine granularity.

In one embodiment, the rising edge of DWL_ret triggers the falling edge of DBL, as shown in the circuit diagram of FIG. 6. Since RESET is an active low signal, the assertion of RESET refers to the falling edge of RESET. The tracking control 230 generates a falling edge of RESET (i.e., asserts RESET) when the DBL drops to a predetermined voltage. The assertion of RESET causes SA_enable assertion. Furthermore, as shown in the circuit diagram of FIG. 6, the falling edge of DWL_ret@Vperi causes RESET to be de-asserted. In one embodiment, the de-assertion of RESET triggers WL de-assertion, which starts the memory pre-charge to be ready for a next access cycle. In some embodiments, the de-assertion of RESET may start the memory pre-charge for a next memory cycle which can be a read operation or a write operation. The RESET de-assertion can be terminated sharply by passing DWL_ret@Vperi through the kill RC circuit 620 (FIG. 6).

Figure 10:
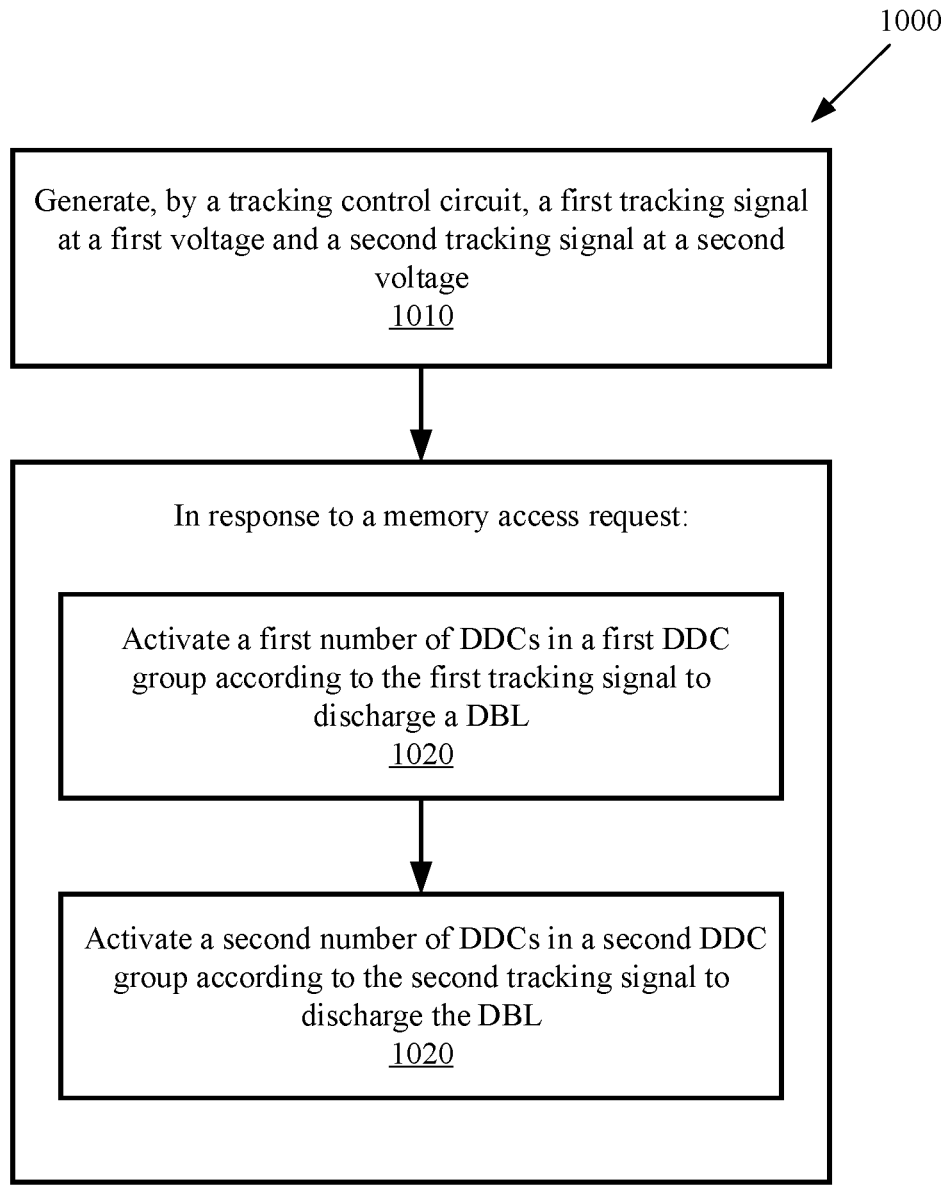
FIG. 10 is a flow diagram illustrating a method of a self-time circuitry according to one embodiment.

FIG. 10 is a flow diagram illustrating a method 1000 of a self-time circuitry according to one embodiment. The self-time circuitry is coupled to a first power rail to receive a first voltage and a second power rail to receive a second voltage. In one embodiment, the self-time circuitry may be the self-time circuitry 400 of FIG. 4, and may be part of the memory device 100 of FIG. 1. Moreover, the self-time circuitry may include any of the components described in connection with FIG. 2 and FIG. 3.

The method 1000 begins when a tracking control circuit generates a first tracking signal at the first voltage and a second tracking signal at the second voltage (step 1010). In response to a memory access request, a first number of DDCs in a first DDC group are activated according to the first tracking signal to discharge a DBL (step 1020), and a second number of DDCs in a second DDC group are activated according to the second tracking signal to discharge the DBL (step 1030). The DBL mimics operations of a bit line in a memory cell array, and the DDCs in the first DDC group and the second DDC group mimic operations of bit cells in the memory cell array.

The operations of the flow diagram of FIG. 10 have been described with reference to the exemplary embodiments of FIGS. 1-4. However, it should be understood that the operations of the flow diagram of FIG. 10 can be performed by embodiments of the invention other than those discussed with reference to FIGS. 1-4, and the embodiments discussed with reference to FIGS. 1-4 can perform operations different than those discussed with reference to the flow diagram. While the flow diagram of FIG. 10 shows a particular order of operations performed by certain embodiments of the invention, it should be understood that such order is exemplary (e.g., alternative embodiments may perform the operations in a different order, combine certain operations, overlap certain operations, etc.).

Embodiments of the invention provide a system and method for adjusting the self-time delay to ensure adequate read and write margins with optimized performance and power for dual-rail memory devices. The self-time delay is generated based on both the core voltage and the peripheral voltage. The self-time delay is tunable at runtime to match the different operation scenarios. This eliminates penalties associated with over-design or over-margining. For extreme dual-rail corners (e.g., periphery voltage less than core voltage by ~400 mv), the embodiments provide a significant timing gain (e.g., 30%-80%) as compared to conventional schemes.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A self-time circuitry coupled to a first power rail to receive a first voltage and a second power rail to receive a second voltage, comprising:
a tracking control circuit operative to generate a first tracking signal at the first voltage and a second tracking signal at the second voltage; and
a plurality of dummy discharge cells (DDCs) including at least a first DDC group and a second DDC group, wherein in response to a memory access request, a first number of DDCs in the first DDC group are activated according to the first tracking signal to discharge a dummy bit line (DBL), and a second number of DDCs in the second DDC group are activated according to the second tracking signal to discharge the DBL, wherein the DBL mimics operations of a bit line in a memory cell array, and the DDCs in the first DDC group and the second DDC group mimic operations of bit cells in the memory cell array.

2. The self-time circuitry of claim 1, wherein the tracking control circuit is further operative to generate a dummy word line (DWL) signal to track assertion of a word line in the memory cell array, and generate the first tracking signal and the second tracking signal based on the DWL signal.

3. The self-time circuitry of claim 2, wherein the tracking control circuit is operative to receive a delay tune signal as an input, wherein the delay tune signal indicates the first number of DDCs and the second number of DDCs to activate.

4. The self-time circuitry of claim 3, wherein the delay tune signal includes a first bit value indicating whether to activate a first subset of the first DDC group and the second DDC group, and a second bit value indicating whether to activate a second subset of the first DDC group and the second DDC group.

5. The self-time circuitry of claim 3, wherein the tracking control circuit further comprises a delay tune logic circuit including a first transistor and a second transistor, a gate of the first transistor connected to the delay tune signal, a gate of the second transistor connected to an inverted delay tune signal, a first terminal of the first transistor and the second transistor connect to a DWL return signal, and a second terminal of the first transistor and the second transistor outputs the first tracking signal or the second tracking signal, wherein the DWL return signal is the DWL signal that passes word line load.

6. The self-time circuitry of claim 2, further comprising: a third DDC group which further includes a first subset activated by a DWL return signal at the first voltage and a second subset activated by the DWL return signal at the second voltage, wherein the DWL return signal is the DWL signal that passes word line load.

7. The self-time circuitry of claim 2, wherein the tracking control circuit further comprises RC kill circuitry including a transistor which is connected to an inverted DWL at a gate and an input DWL at a first terminal, the transistor operative to output an output DWL at a second terminal of the transistor, wherein the output DWL has a sharper falling edge than a corresponding falling edge of the input DWL, and a substantially the same rising edge than a corresponding rising edge of the input DWL.

8. The self-time circuitry of claim 7, wherein the sharper falling edge of the output DWL accelerates termination of a reset signal which starts memory pre-charge.

9. The self-time circuitry of claim 1, wherein each DDC in the first DDC group and the second DDC group includes a first access transistor and a second access transistor, a gate of the first access transistor connected to one of the first tracking signal and the second tracking signal, and a gate of the second access transistor connected to the word line.

10. The self-time circuitry of claim 1, wherein the tracking control circuit further comprises control circuitry which generates a sense amplifier (SA) enable signal when the DBL is discharged to a predetermined voltage, wherein discharge time of the DBL is adjustable by adjusting the first number of DDCs and the second number of DDCs.

11. A method of a self-time circuitry coupled to a first power rail to receive a first voltage and a second power rail to receive a second voltage, comprising:
generating, by a tracking control circuit, a first tracking signal at the first voltage and a second tracking signal at the second voltage; and
in response to a memory access request, activating a first number of dummy discharge cells (DDCs) in a first DDC group according to the first tracking signal to discharge a dummy bit line (DBL), and activating a second number of DDCs in a second DDC group according to the second tracking signal to discharge the DBL,
wherein the DBL mimics operations of a bit line in a memory cell array and the DDCs in the first DDC group and the second DDC group mimic operations of bit cells in the memory cell array.

12. The method of claim 11, further comprising:
generating, by the tracking control circuit, a dummy word line (DWL) signal to track assertion of a word line in the memory cell array; and
generating the first tracking signal and the second tracking signal based on the DWL signal.

13. The method of claim 12, further comprising:
receiving, by the tracking control circuit, a delay tune signal as an input, wherein the delay tune signal indicates the first number of DDCs and the second number of DDCs to activate.

14. The method of claim 13, wherein the delay tune signal includes a first bit value indicating whether to activate a first subset of the first DDC group and the second DDC group, and a second bit value indicating whether to activate a second subset of the first DDC group and the second DDC group.

15. The method of claim 13, wherein the tracking control circuit further comprises a delay tune logic circuit including a first transistor and a second transistor, a gate of the first transistor connected to the delay tune signal, a gate of the second transistor connected to an inverted delay tune signal, a first terminal of the first transistor and the second transistor connect to a DWL return signal, and a second terminal of the first transistor and the second transistor outputs the first tracking signal or the second tracking signal, wherein the DWL return signal is the DWL signal that passes word line load.

16. The method of claim 12, further comprising:
activating a third DDC group, which further includes a first subset activated by a DWL return signal at the first voltage and a second subset activated by the DWL return signal at the second voltage, wherein the DWL return signal is the DWL signal that passes word line load.

17. The method of claim 12, wherein the tracking control circuit further comprises RC kill circuitry including a transistor which is connected to an inverted DWL at a gate and an input DWL at a first terminal, the method further comprising:
outputting by the transistor an output DWL at a second terminal of the transistor, wherein the output DWL has a sharper falling edge than a corresponding falling edge of the input DWL, and a substantially the same rising edge than a corresponding rising edge of the input DWL.

18. The method of claim 17, wherein the sharper falling edge of the output DWL accelerates termination of a reset signal which starts memory pre-charge.

19. The method of claim 11, wherein each DDC in the first DDC group and the second DDC group includes a first access transistor and a second access transistor, a gate of the first access transistor connected to one of the first tracking signal and the second tracking signal, and a gate of the second access transistor connected to the word line.

20. The method of claim 11, further comprising:
adjusting the first number of DDCs and the second number of DDCs to adjust discharge time of the DBL; and
generating a sense amplifier (SA) enable signal by the tracking control circuit when the DBL is discharged to a predetermined voltage.

* * * * *